United States Patent
Coan et al.

(10) Patent No.: US 8,483,631 B2
(45) Date of Patent: Jul. 9, 2013

(54) METHOD AND APPARATUS FOR PREDISTORTING A WAVEFORM FOR INPUT TO AN AMPLIFIER

(75) Inventors: Philip David Coan, La Jolla, CA (US); Paul Joseph Draxler, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 755 days.

(21) Appl. No.: 12/208,266

(22) Filed: Sep. 10, 2008

(65) Prior Publication Data

US 2010/0069023 A1   Mar. 18, 2010

(51) Int. Cl.
*H04B 1/04* (2006.01)

(52) U.S. Cl.
USPC ............... 455/114.3; 455/127.1; 455/115.1; 455/126; 375/296; 375/297

(58) Field of Classification Search
USPC . 455/114.3, 115.1, 127.1, 126; 375/296–297; 330/149
See application file for complete search history.

(56) References Cited

U.S. PATENT DOCUMENTS

| | | | | |
|---|---|---|---|---|
| 5,091,919 A | * | 2/1992 | Kuisma | 375/297 |
| 5,949,283 A | * | 9/1999 | Proctor et al. | 330/149 |
| 6,188,732 B1 | * | 2/2001 | Rha | 375/297 |
| 6,493,400 B1 | * | 12/2002 | Greeley et al. | 375/297 |
| 6,812,792 B2 | * | 11/2004 | Mattsson et al. | 330/149 |
| 7,203,247 B2 | * | 4/2007 | Bauder et al. | 375/296 |
| 2003/0035494 A1 | * | 2/2003 | Bauder et al. | 375/296 |
| 2005/0249309 A1 | * | 11/2005 | Muller et al. | 375/296 |
| 2006/0226903 A1 | * | 10/2006 | Muller et al. | 330/149 |
| 2007/0190952 A1 | * | 8/2007 | Waheed et al. | 455/114.3 |
| 2007/0230420 A1 | * | 10/2007 | Bumiller et al. | 370/338 |
| 2008/0225981 A1 | * | 9/2008 | Reddy et al. | 375/297 |

FOREIGN PATENT DOCUMENTS

| | | |
|---|---|---|
| EP | 0940911 A1 | 9/1999 |
| GB | 2376584 | 12/2002 |
| WO | WO018297 A1 | 2/2001 |

OTHER PUBLICATIONS

International Search Report and the Written Opinion—PCT/US2009/055266, International Search Authority—European Patent.

* cited by examiner

*Primary Examiner* — Edward Urban
*Assistant Examiner* — Rui Hu
(74) *Attorney, Agent, or Firm* — Jeffrey D. Jacobs; Alan C. Gordon

(57) ABSTRACT

A method of predistorting a waveform for input to an amplifier includes receiving information associated with the waveform, the information comprising a modulation configuration of the waveform. The method further includes predicting a chain model for the waveform based on the modulation configuration. In addition, the method includes predistorting the waveform for input to the amplifier, based on the chain model, an ideal waveform, and target output power. An apparatus is also provided for predistorting a waveform for input to an amplifier.

16 Claims, 5 Drawing Sheets

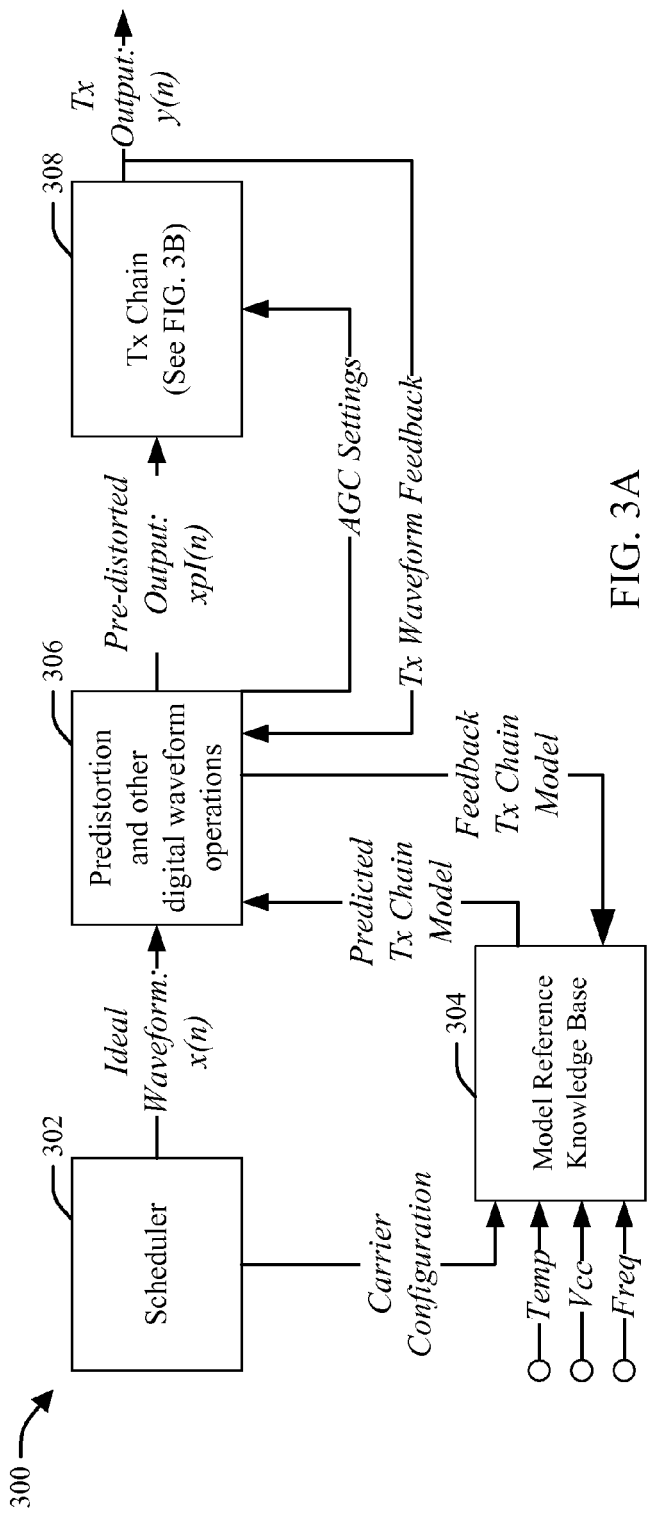
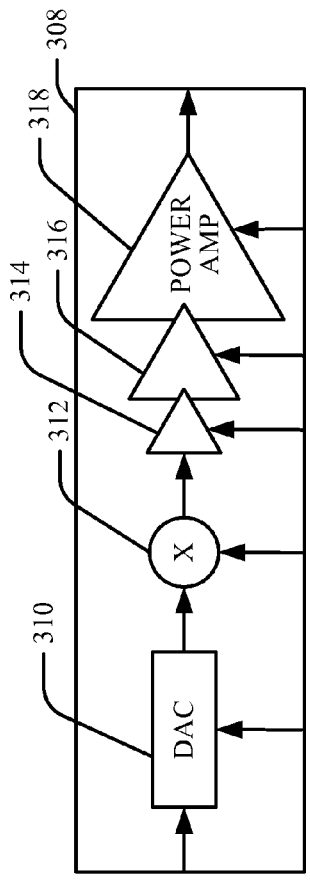
FIG. 3A
FIG. 3B

METHOD AND APPARATUS FOR PREDISTORTING A WAVEFORM FOR INPUT TO AN AMPLIFIER

BACKGROUND

1. Field

The present invention relates to predistortion of a waveform, and more particularly, to a method and apparatus for predistorting a waveform for input to an amplifier.

2. Background

Power amplifiers typically do not behave in a linear manner. More particularly, power amplifier distortion may compress or may expand the output signal swing of the amplifier. Signal detectors receiving and decoding the amplified signals typically do not operate in such a non-linear fashion. Therefore, it is typically necessary to linearize the output of the amplifier.

One approach to such linearization is digital predistortion. Digital predistorters may be used with power amplifiers to invert the power amplifier distortion characteristics by expanding the compression regions and compressing the expansion regions in the power amplifier characteristics curve. For example, when a power amplifier compresses a waveform, the power amplifier typically compresses the peaks of the waveform. In such a case, digital predistortion may compensate for the compression by performing crest enhancement.

Digital predistortion algorithms may require time to adapt to a given amplifier. As such, it is desired to improve the efficiency of digital predistortion algorithms so as to reduce the amount of time needed to adapt to the amplifier.

SUMMARY

In one aspect of the disclosure, a method of predistorting a waveform for input to an amplifier is provided. The method includes receiving information associated with the waveform, the information comprising a modulation configuration of the waveform. The method further includes predicting a chain model for the waveform based on the modulation configuration. In addition, the method includes predistorting the waveform for input to the amplifier, based on the chain model, an ideal waveform, and target output power.

In a further aspect of the disclosure, a predistorter for predistorting a waveform for input to an amplifier is provided. The predistorter includes a processor configured to receive information associated with the waveform, the information comprising a modulation configuration of the waveform. The processor is further configured to predict a chain model for the waveform based on the modulation configuration. In addition, the processor is configured to predistort the waveform for input to the amplifier, based on the chain model, an ideal waveform, and target output power.

In yet a further aspect of the disclosure, a system for transmitting a waveform is provided. The system includes a predistorter configured to receive information associated with the waveform, the information comprising a modulation configuration of the waveform. The predistorter is further configured to predict a chain model for the waveform based on the modulation configuration, and to predistort the waveform for input to the amplifier, based on the chain model, an ideal waveform, and target output power. The system further includes an amplifier configured to amplify the predistorted waveform, and a transmitter configured to transmit the amplified waveform.

In yet a further aspect of the disclosure, an apparatus for predistorting a waveform for input to an amplifier is provided. The apparatus includes means for receiving information associated with the waveform, the information comprising a modulation configuration of the waveform. The apparatus further includes means for predicting a chain model for the waveform based on the modulation configuration. In addition, the apparatus includes means for predistorting the waveform for input to the amplifier, based on the chain model, an ideal waveform, and target output power.

In yet a further aspect of the disclosure, a machine-readable medium encoded with instructions for predistorting a waveform for input to an amplifier is provided. The instructions include code for receiving information associated with the waveform, the information comprising a modulation configuration of the waveform. The instructions further include code for predicting a chain model for the waveform based on the modulation configuration. In addition, the instructions include code for predistorting the waveform for input to the amplifier, based on the chain model, an ideal waveform, and target output power.

It is understood that other configurations of the subject technology will become readily apparent to those skilled in the art from the following detailed description, wherein various configurations of the subject technology are shown and described by way of illustration. As will be realized, the subject technology is capable of other and different configurations and its several details are capable of modification in various other respects, all without departing from the scope of the subject technology. Accordingly, the drawings and detailed description are to be regarded as illustrative in nature and not as restrictive.

BRIEF DESCRIPTION OF THE DRAWINGS

FIGS. 3A and 3B are conceptual block diagrams illustrating an example of a system in which a signal is predistorted for input to an amplifier.

DETAILED DESCRIPTION

Figure 1:
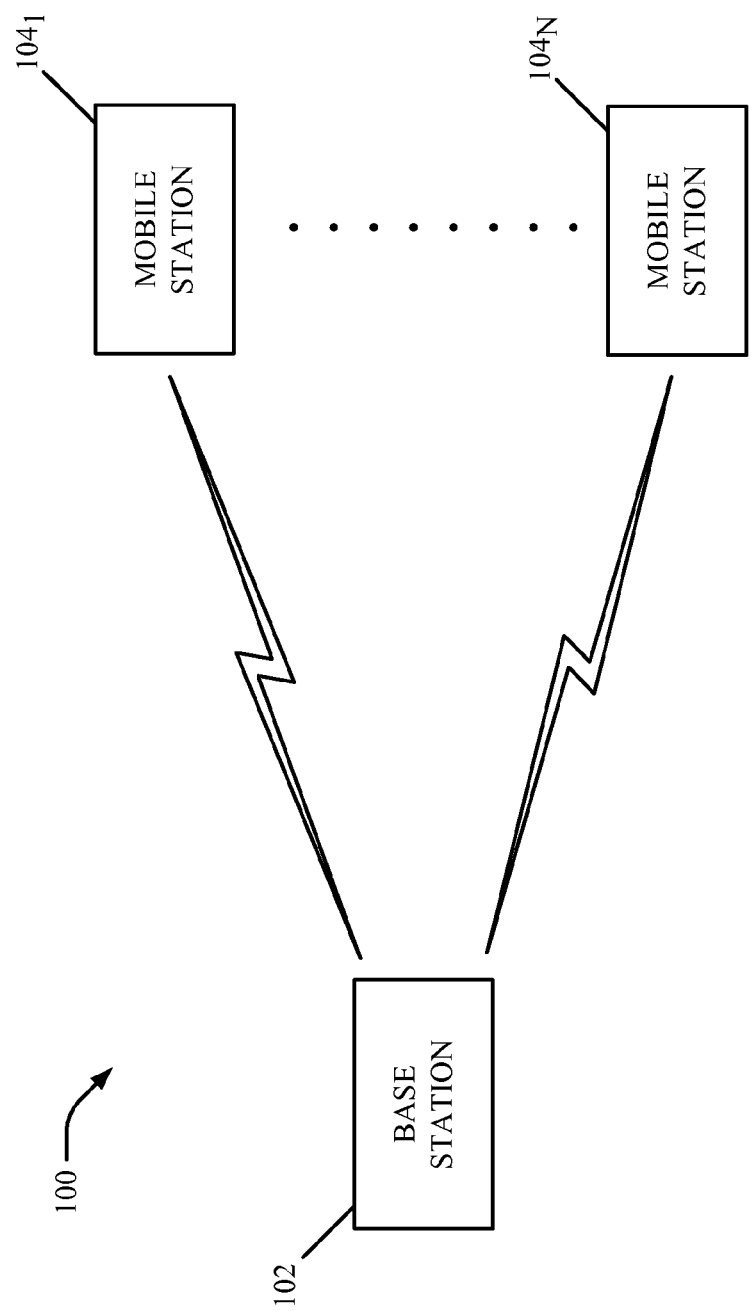
FIG. 1 is a diagram illustrating an example of a wireless communication system in which a transmitter can be used.

FIG. 1 is a diagram illustrating an example of a wireless communication system in which a transmitter can be used. Wireless communication system 100 includes a base station 102 which can communicate with multiple mobile stations $104_1$ to $104_N$. Mobile stations $104_1$ to $104_N$ can also communicate with each other via base station 102. A communication link from the access network to one of mobile stations $104_1$ to $104_N$ is typically referred to as a forward link, and a communication link from one of mobile stations $104_1$ to $104_N$ to base station 102 is typically referred to as a reverse link.

Any of mobile stations $104_1$ to $104_N$ can represent a mobile phone, a computer, a laptop computer, a telephone, a personal digital assistant (PDA), an audio player, a game console, a camera, a camcorder, an audio device, a video device, a multimedia device, a component(s) of any of the foregoing (such as a printed circuit board(s), an integrated circuit(s), and/or a circuit component(s)), or any other device capable of supporting wireless communication. In addition, mobile stations $104_1$ to $104_N$ can be stationary or mobile, and can include digital devices, analog devices or a combination of both.

Communication system 100 can correspond with an Ultra-Wideband (UWB) system, which is a radio technology for Wireless Personal Area Networks (WPAN). Communication system 100 may use one of many other communications protocols. By way of example, communication system 100 may support Evolution-Data Optimized (EV-DO) and/or Ultra Mobile Broadband (UMB). EV-DO and UMB are air interface standards promulgated by the 3rd Generation Partnership Project 2 (3GPP2) as part of the CDMA2000 family of standards and employ multiple access techniques such as Code Division Multiple Access (CDMA) to provide broadband Internet access to mobile subscribers. Alternatively, communication system 100 may support Long Term Evolution (LTE), which is a project within the 3GPP2 to improve the Universal Mobile Telecommunications System (UMTS) mobile phone standard based primarily on a Wideband CDMA (W-CDMA) air interface. Communication system 100 may also support the WiMAX standard associated with the WiMAX forum. These are merely exemplary protocols, and communication system 100 is not limited to these examples.

The actual communications protocol(s) employed by communication system 100 will depend on the specific application and the overall design constraints imposed on the system. The various techniques presented throughout this disclosure are equally applicable to any combination of heterogeneous or homogeneous communication protocols, and can be applicable in a wireless or wired communications system or other types of systems or devices.

Figure 2:
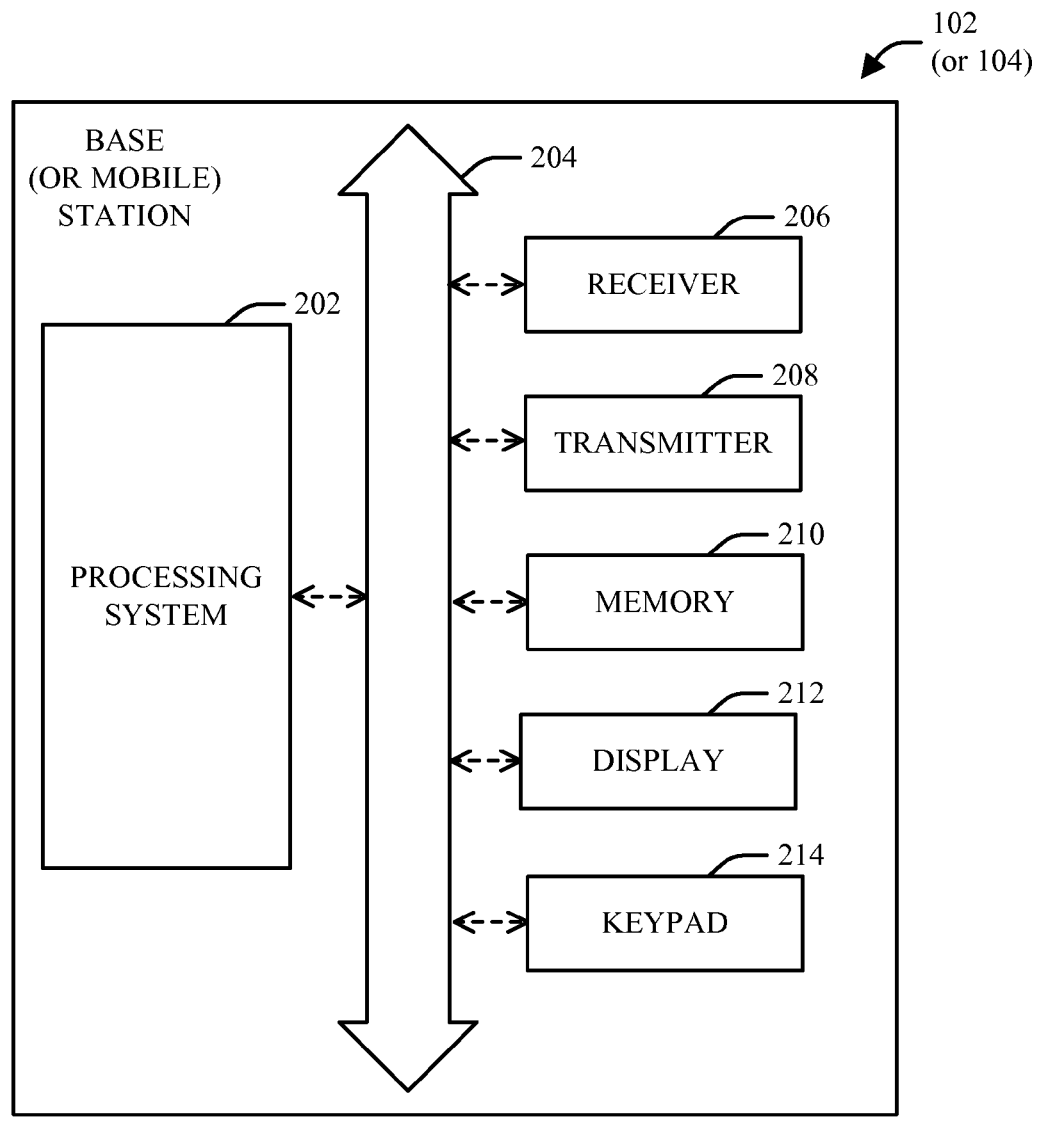
FIG. 2 is a conceptual block diagram illustrating an example of the base (or mobile) station of FIG. 1.

FIG. 2 is a conceptual block diagram illustrating an example of the base (or mobile) station of FIG. 1. Base station 102 or mobile station 104 may include a processing system 202 which is capable of communication with a receiver 206 and transmitter 208 through a bus 204 or other structures or devices. It should be understood that communication means other than busses can be utilized with the disclosed configurations. Processing system 202 can generate audio, video, multimedia, and/or other types of data to be provided to transmitter 208 for communication. In addition, audio, video, multimedia, and/or other types of data can be received at receiver 206, and processed by processing system 202.

Processing system 202 may include a general purpose processor and volatile or non-volatile memory for storing data and instructions for software programs. The software programs, which may be stored in memory 210, may be used by processing system 202 to control and manage access to the various networks, as well as provide other communication and processing functions. The software programs may also provide an interface to processing system 202 for various user interface devices, such as a display 212 and a keypad 214. Processing system 202 may also include a digital signal processor (DSP) with an embedded software layer to offload various signal processing functions, such as convolutional encoding, modulation and spread-spectrum processing. The DSP may also perform encoder functions to support telephony applications.

The various embodiments described below generally relate to predistortion of a signal for input to an amplifier. Such predistortion may be implemented in a base station or a mobile station, such as base station 102 or mobile station 104, so that an amplified signal may be transmitted by transmitter 208 in a more linear manner and may be received and decoded more easily by signal detectors.

FIGS. 3A and 3B are conceptual block diagrams illustrating an example of a system in which a signal is predistorted for input to an amplifier. System 300 includes a scheduler 302 which may provide information (e.g., ideal waveform x(n)) to a predistortion module 306. It should be noted that predistortion module 306 may perform predistortion for a waveform, as well as perform other types of digital waveform operations, which may include, but are not limited to crest factor reduction and memory effect compensation.

Scheduler 302 may also provide information (e.g., carrier configuration) to a model reference knowledge base 304. In this regard, model reference knowledge base 304 may also receive temperature, voltage (e.g., Vcc) and frequency information related to an amplifier (e.g., power amplifier 318 of FIG. 3B).

The carrier configuration information provided to model reference knowledge base 304 and the ideal waveform x(n) provided to predistortion module 306 may correspond with information for different waveform types (e.g., modulation configuration). According to an embodiment, it is observed that the appropriate predistortion factor may be dependent on the waveform type. For example, in the physical layer (PHY) like the ultra mobile broadband (UMB) mobile reverse link, the modulation configuration can change significantly from one frame to the next.

Model reference knowledge base 304 may use the carrier configuration, temperature, Vcc and frequency information to generate a predicted Tx chain model. The predicted Tx chain model may correspond with a prediction of the output of a power amplifier (e.g., power amplifier 318 of FIG. 3B) with no predistortion. Model reference knowledge base 304 may provide the predicted Tx chain model to predistortion module 306.

Using the ideal waveform information, the predicted Tx chain model, and target output power, predistortion module 306 may apply inverse distortion at the input of the amplifier, to linearize the output of power amplifier 318. Such inverse distortion may correspond with FIG. 3A's predistorted output xpl(n).

As noted above, since predistortion module 306 receives an ideal waveform x(n) as input, and since model reference knowledge base receives carrier configuration as input, predistortion module 306 is seen to be associated with different waveform types (e.g., modulation configuration). Accordingly, when there are changes to modulation, previous modulation knowledge in model reference knowledge base 304 may be used to update the predistortion characteristics of a waveform provided to predistortion module 306.

As can be seen in FIG. 3A, predistortion module 306 may output predistorted output xpl(n) to Tx chain module 308. Predistortion module may also provide automatic gain control (AGC) settings to Tx chain module 308.

With reference to FIG. 3B, Tx chain module 308 may include a digital-to-analog converter (DAC) 310, a mixer 312, driver amplifiers 314 and 316 and a power amplifier 318 (e.g., an RF power amplifier).

Based on the predistorted output xpl(n) and the AGC settings from predistortion module 308, Tx chain module 308 may amplify the waveform. In this regard, DAC 310 may convert the predistorted output signal xpl(n) to an analog signal, and driver amplifiers 314 and 316 may further process the signal. Power amplifier 318 may amplify the signal to produce Tx output signal y(n). Since the predistorted output signal xpl(n) typically corresponds with an inverse distortion of the predicted Tx chain, the Tx output signal y(n) will likely be a linear amplified form of the waveform x(n).

The above embodiments describing predistorting of an input signal relate to both an open-loop configuration and a close-loop configuration. In an open-loop configuration, output feedback is not typically provided to the predistortion algorithm associated with predistorter module 306. This is different than a closed-loop configuration, in which waveform type information (e.g., modulation configuration) about the output transmit waveform may be given to the predistortion algorithm, and the predistortion algorithm may adjust to optimize the predistortion for that waveform.

For example, as seen in FIG. 3A, Tx waveform feedback associated with Tx output signal y(n) may be provided to predistorion module 306. Predistortion module 306 may update model reference knowledge base 304 via feedback Tx chain model, to optimize the predistortion algorithm. This corresponds to a closed-loop configuration. Such updating can also be seen to correspond with adaptive predistortion, since the Tx chain model is adjusted as the Tx chain changes performance.

In this regard, a conventional adaptive predistortion algorithm may take a significant number of adaptation cycles to adjust. According to one embodiment, by using the waveform type (e.g., modulation configuration) as input to the predistortion algorithm, adaptation time may be shortened. In other words, the number of cycles to adapt may decrease with knowledge of the behavior of power amplifier 318.

As noted above, in an open-loop configuration, output waveform feedback is typically not provided to the predistortion algorithm. For example, with reference to FIG. 3A, Tx output signal y(n) would typically not be provided to predistorion module 306, and predistorion module 306 would typically not provide feedback Tx chain model to model reference knowledge base 304. As such, an open-loop configuration is typically not seen to correspond with an adaptive predistortion algorithm.

In an open-loop configuration, inputs about the environment (e.g., scheduler information, temperature, Vcc, frequency) associated with power amplifier 318 are received, but feedback from the output signal is not provided. Rather, this configuration typically relies on past knowledge and characterization of power amplifier 318, to create the predicted Tx chain model for predistortion module 306.

Whether in a closed-loop or open-loop configuration, Tx output signal y(n) from Tx chain 308 of FIG. 3A may correspond with a signal for transmission by a transmitter (e.g., transmitter 208 of base station 102 or mobile station 104). In addition, it should be noted that the embodiments described herein may apply to single-mode and multi-mode transmitters.

Accordingly, the above-described embodiments for predistorting an input signal to an amplifier are seen to shorten adaptation time in a closed-loop configuration, or to select the appropriate predistortion in an open loop configuration. Further, the above-described embodiments are seen to provide for more range at higher data rates. In addition, more efficiency can be realized. Further, the above-described embodiments are seen to support a higher-order modulation for a transmit chain, because of the improved linearity of the transmit chain.

Figure 4:
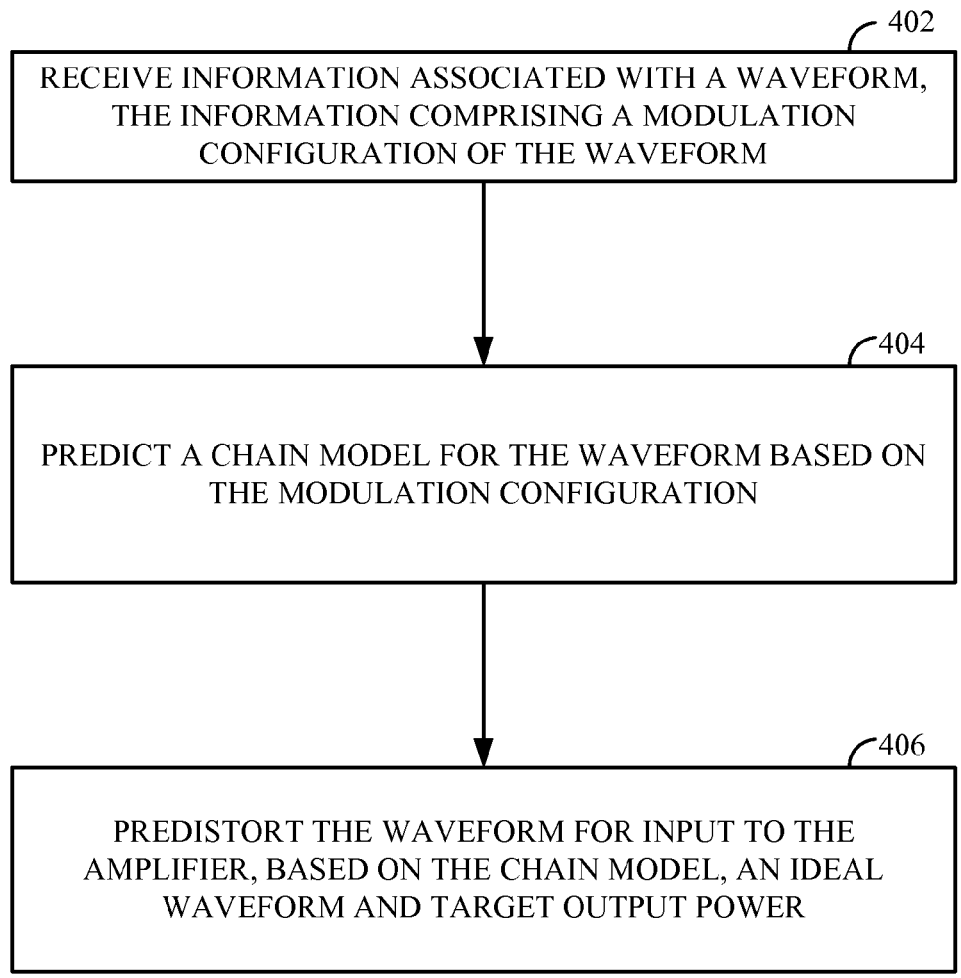
FIG. 4 is a flowchart illustrating an exemplary operation of predistorting a waveform for input to an amplifier.

FIG. 4 is a flowchart illustrating an exemplary operation of predistorting a waveform for input to an amplifier. In step 402, information associated with the waveform is received, the information comprising a modulation configuration of the waveform. In step 404, a chain model is predicted for the waveform based on the modulation configuration. In step 406, the waveform is predistorted for input to the amplifier, based on the chain model, an ideal waveform, and target output power.

Figure 5:
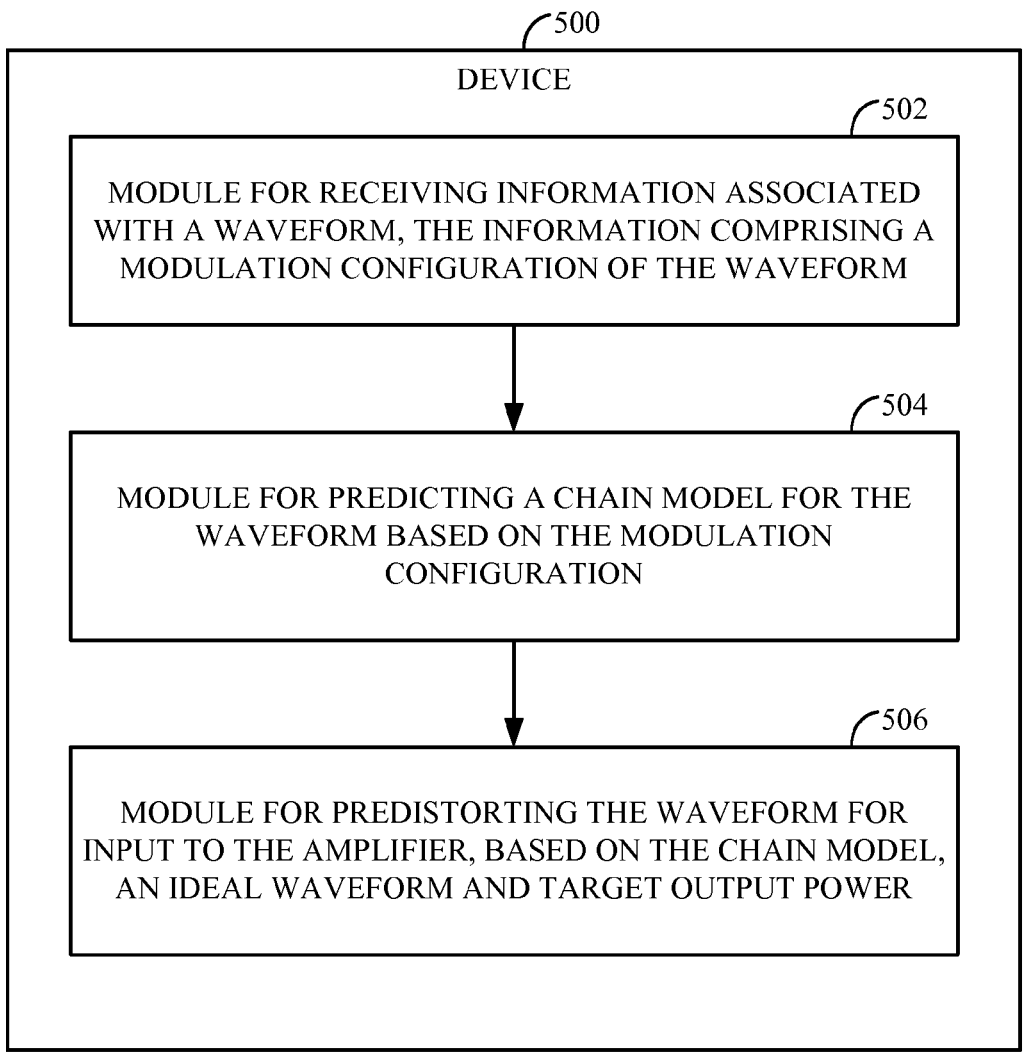
FIG. 5 is a conceptual block diagram illustrating an example of the functionality of a device for predistorting a waveform for input to an amplifier.

FIG. 5 is a conceptual block diagram illustrating an example of the functionality of a device for predistorting a waveform for input to an amplifier. Device 500 includes a module 502 for receiving information associated with the waveform, the information comprising a modulation configuration of the waveform. Device 500 further includes a module 504 for predicting a chain model for the waveform based on the modulation configuration. In addition, device 500 includes a module for predistorting the waveform for input to the amplifier, based on the chain model, an ideal waveform, and target output power.

Referring back to FIG. 2, processing system 202 may be implemented using software, hardware, or a combination of both. By way of example, processing system 202 may be implemented with a processor. A processor may be related to one or more processors, and a processor may be included in a module. A processor may be a general-purpose microprocessor, a microcontroller, a digital signal processor (DSP), an application specific integrated circuit (ASIC), a field programmable gate array (FPGA), a programmable logic device (PLD), a controller, a state machine, gated logic, discrete hardware components, or any other suitable device that can perform calculations or other manipulations of information. Processing system 202 may also include one or more machine-readable media for storing software. Software shall be construed broadly to mean instructions, data, or any combination thereof, whether referred to as software, firmware, middleware, microcode, hardware description language, or otherwise. Instructions may include code (e.g., in source code format, binary code format, executable code format, or any other suitable format of code).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

Those of skill in the art would appreciate that the various illustrative blocks, modules, elements, components, methods, and algorithms described herein may be implemented as electronic hardware, computer software, or combinations of both. Skilled artisans may implement the described functionality in varying ways for each particular application. Furthermore, various components and blocks may be arranged differently (e.g., arranged in a different order, or partitioned in a different way) all without departing from the scope of the subject technology.

It is understood that the specific order or hierarchy of steps in the processes disclosed is an illustration of exemplary approaches. Based upon design preferences, it is understood that the specific order or hierarchy of steps in the processes may be rearranged. The accompanying method claims present elements of the various steps in a sample order, and are not meant to be limited to the specific order or hierarchy presented.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description is provided to enable any person skilled in the art to practice the various configurations described herein. Various modifications to these configurations will be readily apparent to those skilled in the art, and the generic principles defined herein may be applied to other configurations. Thus, the claims are not intended to be limited to the configurations shown herein, but is to be accorded the full scope consistent with the claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the invention.

The terms used herein such as "for example," "for instance," "example," "instance," "by way of example," "such as," and the like indicate an illustration by way of example, and not by way of limitation. All structural and functional equivalents to the elements of the various configurations described throughout this disclosure that are known or later come to be known to those of ordinary skill in the art are expressly incorporated herein by reference and are intended to be encompassed by the claims.

What is claimed is:

1. A method of processing a waveform for input to an amplifier, the method comprising:
   receiving carrier configuration information associated with the waveform at a model reference knowledge base, the carrier configuration information received independent from an output of the amplifier and comprising waveform type data that is indicative of a modulation configuration of the waveform;
   determining a chain model that includes adjusting a predistortion factor for the waveform based on the carrier configuration information received independent from the output of the amplifier, the determining of the chain model performed at the model reference knowledge base;
   determining a change in the modulation configuration of the waveform;
   updating the chain model and the predistortion factor in response to the change in the modulation configuration of the waveform, wherein the chain model and the predistortion factor are updated in part in an open loop configuration using previous modulation data associated with the change in the modulation configuration, the previous modulation data stored at the model reference knowledge base;
   receiving, at a predistortion module, an output feedback signal from the output of the amplifier;
   receiving, at the model reference knowledge base, a feedback transmission chain model from the predistortion module, the feedback transmission chain model based on the output feedback signal;
   optimizing, in part in a closed loop configuration, the updated chain model and the updated predistortion factor at the model reference knowledge base using the feedback transmission chain model; and
   predistorting the waveform for input to the amplifier based on the optimized chain model, the optimized predistortion factor, and target output power.

2. The method of claim 1, further comprising adjusting the chain model based on environmental information associated with the amplifier.

3. The method of claim 2, wherein the environmental information comprises at least one of temperature, Vcc, and/or frequency.

4. The method of claim 1, wherein the waveform type data indicates at least a rate of change of the modulation configuration from one frame to a next frame of the waveform.

5. A predistorter for predistorting a waveform for input to an amplifier, comprising:
   a processing system configured to
      receive carrier configuration information associated with the waveform at a model reference knowledge base, the carrier configuration information received independent from an output of the amplifier and comprising waveform type data that is indicative of a modulation configuration of the waveform,
      determine a chain model that includes adjusting a predistortion factor for the waveform based on the carrier configuration information received independent from the output of the amplifier, the determination of the chain model performed at the model reference knowledge base,
      determine a change in the modulation configuration of the waveform,
      update the chain model and the predistortion factor in response to the change in the modulation configuration of the waveform, wherein the chain model and the predistortion factor are updated in part in an open loop configuration using previous modulation data associated with the change in the modulation configuration, the previous modulation data stored at the model reference knowledge base,
      receive, at a predistortion module, an output feedback signal from the output of the amplifier,
      receive, at the model reference knowledge base, a feedback transmission chain model from the predistortion module, the feedback transmission chain model based on the output feedback signal,
      optimize, in part in a closed loop configuration, the updated chain model and the updated predistortion factor at the model reference knowledge base using the feedback transmission chain model, and
      predistort the waveform for input to the amplifier based on the optimized chain model, the optimized predistortion factor, and target output power.

6. The predistorter of claim 5, further comprising adjusting the chain model based on environmental information associated with the amplifier.

7. The predistorter of claim 6, wherein the environmental information comprises at least one of temperature, Vcc, and/or frequency.

8. The predistorter of claim 5, wherein the waveform type data indicates at least a rate of change of the modulation configuration from one frame to a next frame of the waveform.

9. A system for transmitting a waveform, comprising:
a predistorter configured to
receive carrier configuration information associated with the waveform at a model reference knowledge base, the carrier configuration information received independent from an output of an amplifier and comprising waveform type data that is indicative of a modulation configuration of the waveform,
determine a chain model that includes adjusting a predistortion factor for the waveform based on the carrier configuration information received independent from the output of the amplifier, the determination of the chain model performed at the model reference knowledge base,
determine a change in the modulation configuration of the waveform,
update the chain model and the predistortion factor in response to the change in the modulation configuration of the waveform, wherein the chain model and the predistortion factor are updated in part in an open loop configuration using previous modulation data associated with the change in the modulation configuration, the previous modulation data stored at the model reference knowledge base,
receive, at a predistortion module, an output feedback signal from the output of the amplifier,
receive, at the model reference knowledge base, a feedback transmission chain model from the predistortion module, the feedback transmission chain model based on the output feedback signal,
optimize, in part in a closed loop configuration, the updated chain model and the updated predistortion factor at the model reference knowledge base using the feedback transmission chain model, and
predistort the waveform based on the optimized chain model, the optimized predistortion factor, and target output power, wherein the amplifier is configured to amplify the predistorted waveform; and
a transmitter configured to transmit the amplified waveform.

10. The system of claim 9, further comprising adjusting the chain model based on environmental information associated with the amplifier.

11. The system of claim 10, wherein the environmental information comprises at least one of temperature, Vcc, and/or frequency.

12. The system of claim 9, wherein the waveform type data indicates at least a rate of change of the modulation configuration from one frame to a next frame of the waveform.

13. An apparatus for processing a waveform for input to an amplifier, the apparatus comprising:
means for receiving carrier configuration information associated with the waveform at a model reference knowledge base, the carrier configuration information received independent from an output of the amplifier and comprising waveform type data that is indicative of a modulation configuration of the waveform;
means for determining a chain model that includes adjusting a predistortion factor for the waveform based on the carrier configuration information received independent from the output of the amplifier, the determination of the chain model performed at the model reference knowledge base;
means for determining a change in the modulation configuration of the waveform;
means for updating the chain model and the predistortion factor in response to the change in the modulation configuration of the waveform, wherein the chain model and the predistortion factor are updated in part in an open loop configuration using previous modulation data associated with the change in the modulation configuration, the previous modulation data stored at the model reference knowledge base;
means for receiving, at a predistortion module, an output feedback signal from the output of the amplifier;
means for receiving, at the model reference knowledge base, a feedback transmission chain model from the predistortion module, the feedback transmission chain model based on the output feedback signal;
means for optimizing, in part in a closed loop configuration, the updated chain model and the updated predistortion factor at the model reference knowledge base using the feedback transmission chain model; and
means for predistorting the waveform for input to the amplifier based on the optimized chain model, the optimized predistortion factor, and target output power.

14. The apparatus of claim 13, wherein the waveform type data indicates at least a rate of change of the modulation configuration from one frame to a next frame of the waveform.

15. A non-transitory computer readable medium having instructions stored thereon for processing a waveform for input to an amplifier, the instructions which when executed by at least one processor causes the processor to:
receive carrier configuration information associated with the waveform at a model reference knowledge base, the carrier configuration information received independent from an output of the amplifier and comprising waveform type data that is indicative of a modulation configuration of the waveform;
determine a chain model that includes adjusting a predistortion factor for the waveform based on the carrier configuration information received independent from the output of the amplifier, the determination of the chain model performed at the model reference knowledge base;
determine a change in the modulation configuration of the waveform,
update the chain model and the predistortion factor in response to the change in the modulation configuration of the waveform, wherein the chain model and the predistortion factor are updated in part in an open loop configuration using previous modulation data associated with the change in the modulation configuration, the previous modulation data stored at the model reference knowledge base,
receive, at a predistortion module, an output feedback signal from the output of the amplifier,
receive, at the model reference knowledge base, a feedback transmission chain model from the predistortion module, the feedback transmission chain model based on the output feedback signal,
optimize, in part in a closed loop configuration, the updated chain model and the updated predistortion factor at the model reference knowledge base using the feedback transmission chain model, and predistort the waveform for input to the amplifier based on the optimized chain model, the predistortion factor, and target output power.

16. The computer readable medium of claim 15, wherein the waveform type data indicates at least a rate of change of the modulation configuration from one frame to a next frame of the waveform.

* * * * *